United States Patent [19]
Fischer et al.

[11] Patent Number: 5,701,032
[45] Date of Patent: *Dec. 23, 1997

[54] INTEGRATED CIRCUIT PACKAGE

[75] Inventors: Paul James Fischer; William George Petefish, both of Eau Claire, Wis.

[73] Assignee: W. L. Gore & Associates, Inc., Newark, Del.

[*] Notice: The term of this patent shall not extend beyond the expiration date of Pat. No. 5,525,834.

[21] Appl. No.: 552,359

[22] Filed: Nov. 2, 1995

Related U.S. Application Data

[63] Continuation of Ser. No. 323,985, Oct. 17, 1994, Pat. No. 5,525,834.

[51] Int. Cl.⁶ .................................................. H01L 23/48
[52] U.S. Cl. .......................... 257/692; 257/690; 257/784; 257/786
[58] Field of Search .................................. 257/690, 692, 257/691, 678, 700, 784, 786

[56] References Cited

U.S. PATENT DOCUMENTS

| | | | |
|---|---|---|---|
| 3,617,817 | 11/1971 | Kawakatsu et al. | 257/691 |
| 4,499,149 | 2/1985 | Berger | 428/447 |
| 4,608,592 | 8/1986 | Miyamoto | 257/700 |
| 4,996,097 | 2/1991 | Fischer | 428/220 |
| 5,034,801 | 7/1991 | Fischer | 257/687 |

(List continued on next page.)

FOREIGN PATENT DOCUMENTS

| | | |
|---|---|---|
| 0 295 948 | 12/1988 | European Pat. Off. . |
| 0 459 179 | 12/1991 | European Pat. Off. . |
| 0 645 810 | 3/1995 | European Pat. Off. . |
| 63 081956 | 8/1988 | Japan . |
| 2 077 142 | 3/1990 | Japan . |
| 03 060 061 | 5/1991 | Japan . |
| 03 112 155 | 8/1991 | Japan . |
| 04 162756 | 9/1992 | Japan . |
| 04 208555 | 11/1992 | Japan . |
| 84 01470 | 4/1984 | WIPO . |

OTHER PUBLICATIONS

"Thin Film Module," IBM Technical Disclosure Bulletin, vol. 31, No. 8, Jan. 1989, New York, pp. 135–138.
"Mounting Open–Via Chip–Carriers (for 100 to 300, input/output i.c.)", 4th IEEE/CHMT European IEMTS, Jun. 13–15, 1988, Neuilly Sur Seine, France, pp. 34–36, C.M. Val et al.

(List continued on next page.)

*Primary Examiner*—Jerome Jackson
*Assistant Examiner*—Nathan K. Kelley
*Attorney, Agent, or Firm*—Victor M. Genco, Jr.

[57] ABSTRACT

An integrated circuit package for housing an integrated circuit (IC) chip and providing electrical connectivity of data signals and voltage signals between the IC chip and an electronic component includes a substrate, an IC chip affixed to the substrate and at least three conductive layers on the substrate. The three conductive layers include at least a first voltage layer adjacent to the substrate for providing a first reference voltage signal (i.e., ground) to the IC chip, a second voltage layer for providing a second reference voltage signal (i.e., power) to the IC chip, and a signal layer. To maximize speed and minimize complexing all of the data signals to the IC chip are routed on the signal layer. The power and ground layers are closely coupled and separated by a dielectric layer having a relatively high dielectric constant for providing significant decoupling capacitance. A low dielectric layer is provided for separating the power layer from the signal layer. A plurality of electrical connections interconnect bonding pads on the IC chip with the electronic component (e.g., a PCB) by way of at least one of the conductive layers.

3 Claims, 7 Drawing Sheets

U.S. PATENT DOCUMENTS

| | | | |
|---|---|---|---|
| 5,132,778 | 7/1992 | Juskey et al. | 257/793 |
| 5,136,366 | 8/1992 | Worp et al. | 257/687 |
| 5,153,385 | 10/1992 | Juskey et al. | 174/260 |
| 5,166,772 | 11/1992 | Soldner et al. | 257/659 |
| 5,216,278 | 6/1993 | Lin et al. | 257/685 |
| 5,218,759 | 6/1993 | Juskey et al. | 29/840 |
| 5,220,489 | 6/1993 | Barreto et al. | 361/783 |
| 5,239,198 | 8/1993 | Lin et al. | 257/693 |
| 5,284,287 | 2/1994 | Wilson et al. | 228/180.22 |
| 5,285,352 | 2/1994 | Pastore et al. | 361/707 |
| 5,293,069 | 3/1994 | Kato et al. | 257/698 |
| 5,296,738 | 3/1994 | Freyman et al. | 257/684 |
| 5,355,283 | 10/1994 | Marrs et al. | 361/760 |
| 5,376,588 | 12/1994 | Pendse | 437/211 |
| 5,394,009 | 2/1995 | Loo | 257/660 |
| 5,397,917 | 3/1995 | Ommen et al. | 257/698 |
| 5,525,834 | 6/1996 | Fischer et al. | 257/691 |

OTHER PUBLICATIONS

"New BGA Design Concept," IBM Technical Disclosure Bulletin, vol. 37, No. 6A, Jun. 1994 New York U.S., pp. 23–24.

"Leistung Richtig Verpackt," Elektronik, vol. 41, No. 110, May 12, 1992, G. Warson et al., pp. 92–96.

"An 820 Pin PGA For Ultralarge–Scale BiCMOS Device," IEEE Transactions on Components, Hybrids and Manufacturing Technology, vol. 16, No. 8, Dec. 1993, Y. Hiruta et al., pp. 893–901.

"Chip Attachment to Tape and Cable," IBM Technical Disclosure Bulletin, vol. 25, No. 4, Sep. 1982, J.C. Edwards, pp. 1954–1956.

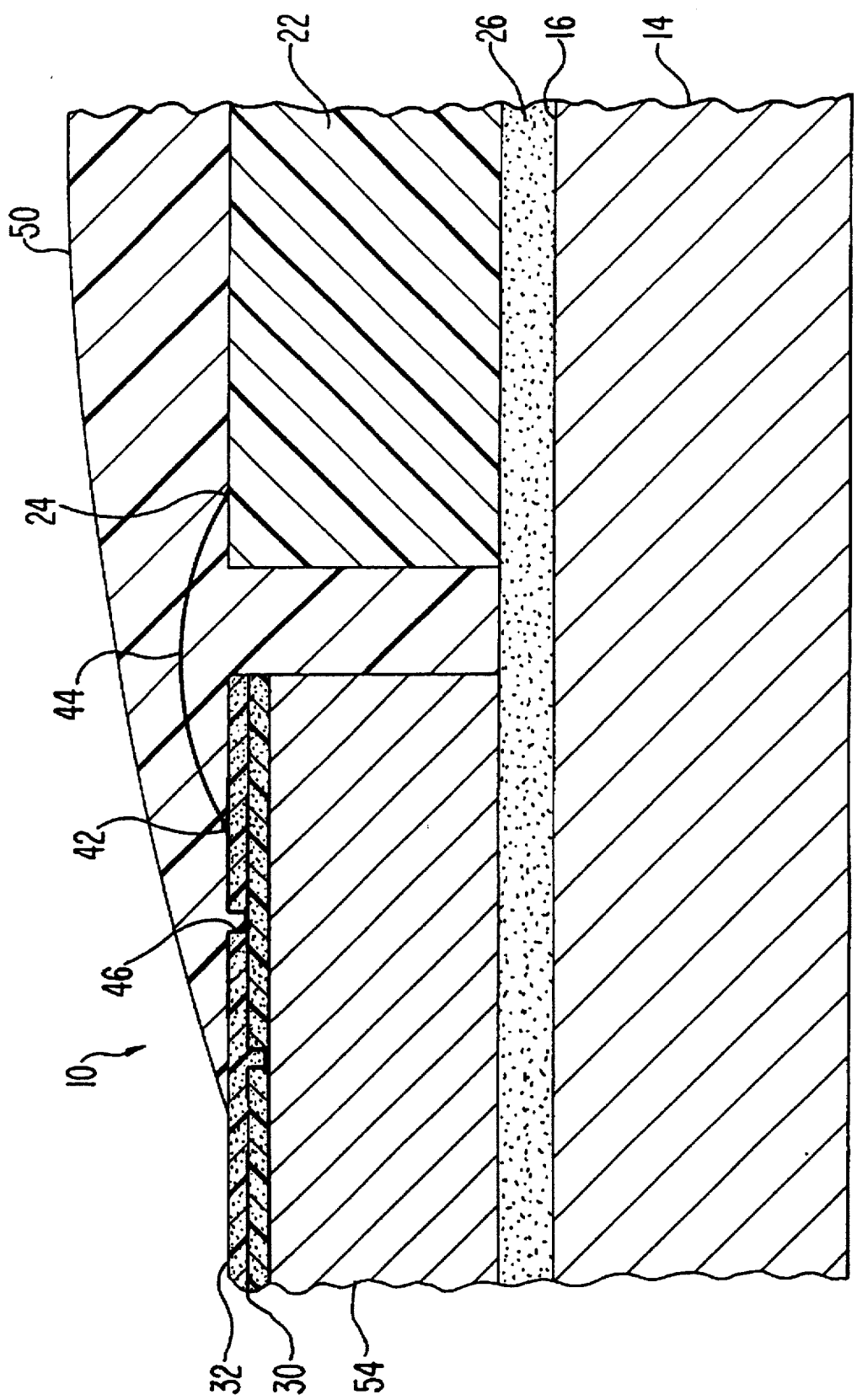

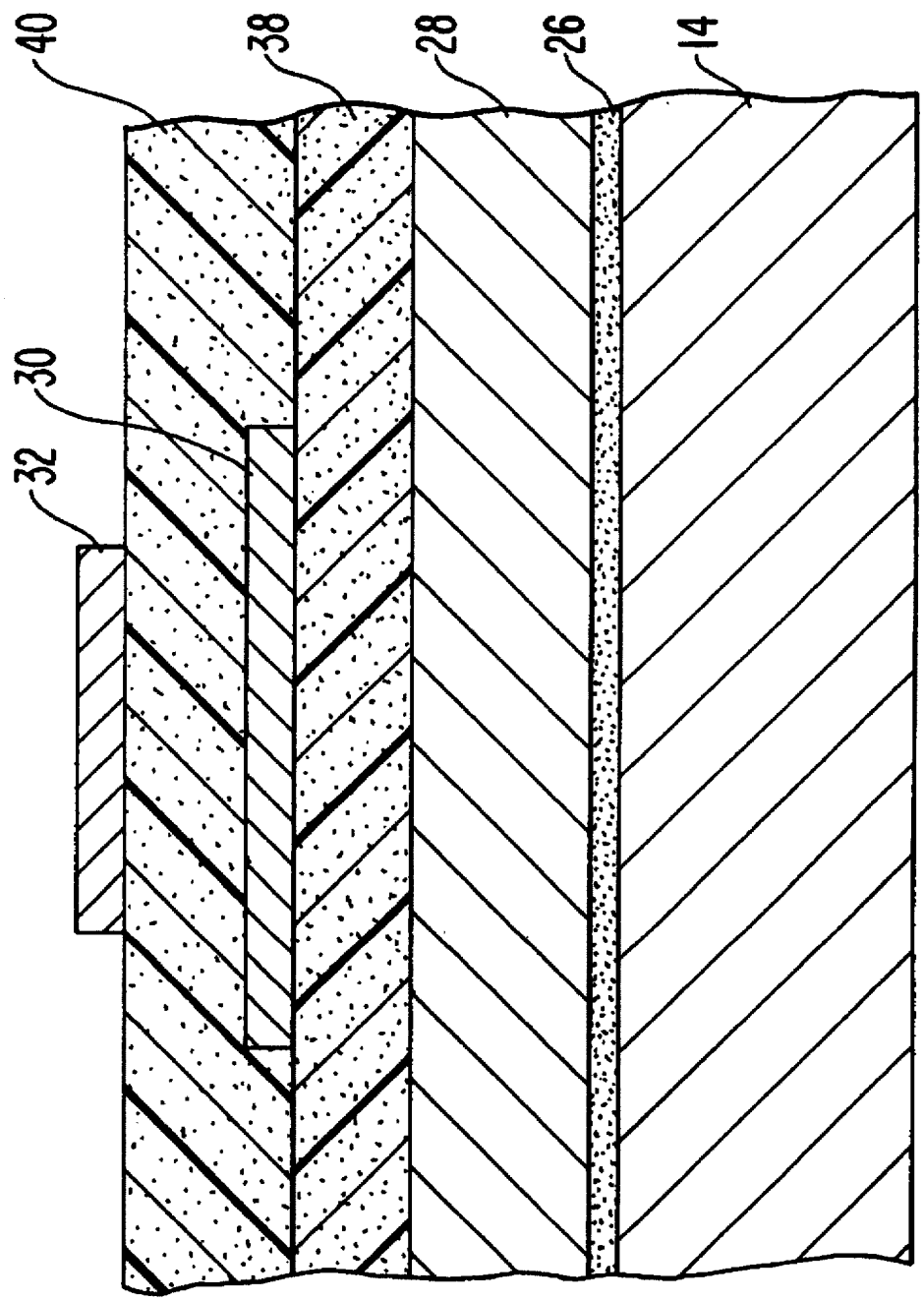

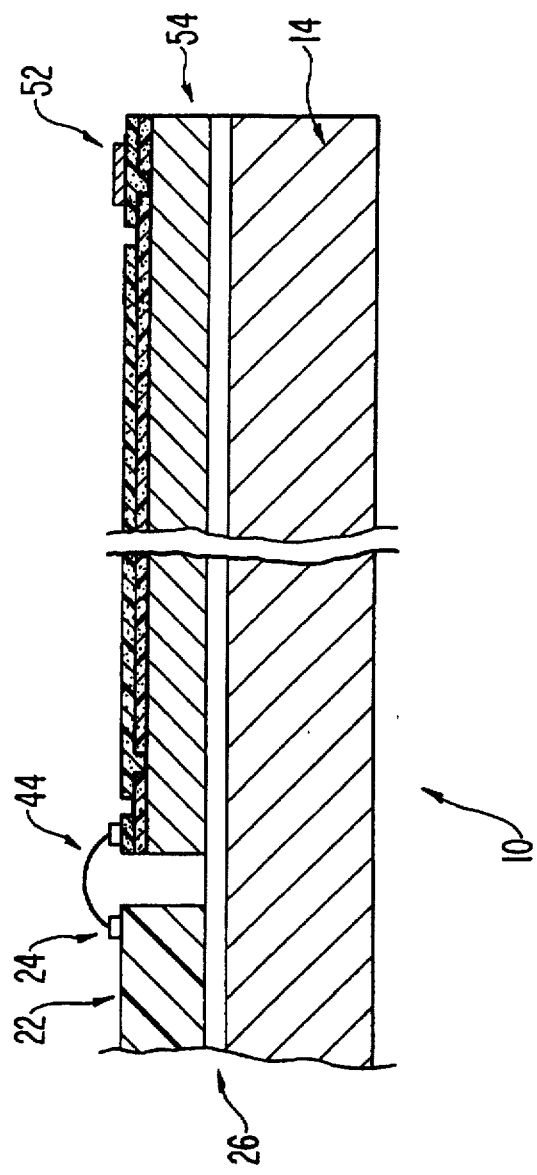
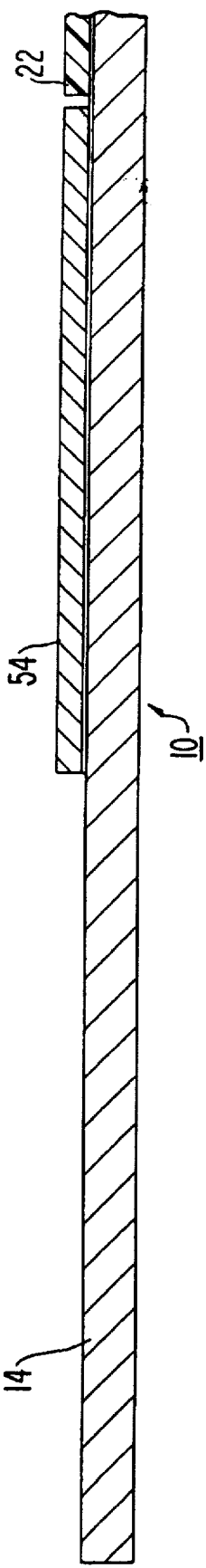

INTEGRATED CIRCUIT PACKAGE

This is a continuation of application Ser. No. 08/323,985, filed Oct. 17, 1994, U.S. Pat. No. 5,525,834.

FIELD OF THE INVENTION

The present invention relates to integrated circuit packages, and more particularly, to a high performance package for an integrated circuit.

BACKGROUND OF THE INVENTION

The function of an integrated circuit package is to provide protection of the circuit, distribute power and signals, and dissipate heat. Rapid advances in semiconductor technology have out paced developments in semiconductor packaging techniques. Specifically, increases in the number of signal and power connections on integrated circuits, larger chip sizes, increased power consumption and higher operating frequencies strain the ability of traditional semiconductor packages to provide reliable, cost-effective performance. While some recent advances in packaging technologies have begun to address some of the needs of higher performance integrated circuits, improved packaging technologies are still needed to allow high I/O count and increased density integrated circuits to perform to levels intended by their designers.

Packaging technologies, such as thin quad flat packs (TQFPs), ball grid arrays (BGAs), tape automated bonding (TAB), ultra-thin packages, bare chips or chip-on-board (COB), flip-chip assemblies and multichip modules (MCMs) are now being developed and improved to address performance issues.

In a BGA, in lieu of package pins, an array of solder balls is located on the bottom of a substrate. BGAs permit higher I/O counts without requiring the fine line printed wiring boards required for peripherally leaded packages. BGA yields are typically higher than those for fine-pitch packages, since they have more space between contacts. Further, BGA packages will withstand some degree of mishandling without damaging the leads, whereas fine lead parts must be handled with care before soldering so that the leads are not bent or broken. Thus, BGAs can provide as good as, if not better cost per pin than QFPs. Other benefits of BGAs are that they provide short trace lengths between the package and the printed circuit board (PCB), which reduces signal inductance, and they have a lower profile and a smaller package than QFPs, which allows for more parts to be placed on a board. The small size also means shorter distances between parts, again reducing signal delays. Moreover, since BGAs have large channels between pads, more signals can be routed on the circuit board.

In addition to electrical requirements, heat dissipation is a key factor in designing a semiconductor package, especially since integrated circuit devices are now often used in areas which have little of no air flow. Typically, heat dissipation has been provided through increased air flow (e.g., via fans) and through the use of cooling systems. Techniques for heat dissipation include liquid-cooling techniques, refrigeration, and immersion. However, these techniques are often expensive and impractical for an IC package. A ceramic package is able to handle higher wattages than a plastic package, but ceramic generally is both more expensive and more fragile than plastic. In order to increase heat dissipation in plastic packages, some packages provide thermal vias and heat spreaders between pads. Since; the space between pads in BGAs is relatively large, thermal vias can be placed directly under the chip.

The performance of a package is a function of how many I/O it can provide the integrated circuit, how low the inductance of the signal and power distribution paths, and how well the package removes heat. The cost of a packaging solution is a function of the cost of the package, the assembly process and the cost of preparing the integrated circuit for the type of assembly.

BGA packages have been constructed using plastic, ceramic, and thin film redistribution on top of plastic and ceramic. In the most common case, an integrated circuit is wire bonded to a plastic or ceramic substrate. The die is face up, with its back side bonded to the substrate. On the opposite side of the substrate are the solder balls. Wire bonds are then run from the top of the die and fanned out to the substrate. If thin film redistribution is used, the number of wire bonds can be greater and the length somewhat short because the fan out is done in the thin film. While the increase in the number of I/O and the reduced wire bond length is beneficial, the wire bonds are still longer than is desirable because the die bonding surface is as high as 25 mils above the substrate. This leads to minimum wire bond length of approximately 50 mils with the distance to power and ground still further due to the path traveled in the thin film to a power/ground via. Additionally, the thermal path is through the substrate with this configuration and is unsatisfactory for high performance integrated circuits. Thermal vias can be added to the substrate to marginally improve the heat transfer, but the heat flow is still limited by the printed wiring board. Using thin film redistribution also adds significant cost to the package.

Plastic packages with heat slugs and ceramic packages have been used with cavities where the die is bonded in the cavity and the package is configured in a cavity down arrangement. To handle medium to high I/O counts in this configuration multiple signal bonding shelves are built into the package. While these packages represent an improvement in thermal performance over the ones above the requirement of multiple bonding rows significantly increase the wire bond length. Lengths of 150 mils are common. This wire length increases the inductance of the signal and power distribution limiting the frequency of operation, the number of I/O that can be switched simultaneously on the integrated circuit, and hence limits the performance of the integrated circuit.

Flip chip die attach has been used with the thin film redistribution packages above greatly improving the number of I/O connections. However, cost for the additional metallurgy on the integrated circuit, lack of infrastructure for integrated circuits or this type of assembly and the requirements for adding a metal lid on the package make this method currently cost prohibitive.

Another drawback of ceramic packages is that the coefficient of thermal expansion (CTE) of ceramic is very different from the CTE of the printed circuit board (PCB), such as a typical FR-4 board. Mismatches in CTE can cause stress on solder joints and wire bonds, resulting in poor reliability.

Semiconductor packages are subjected to high temperatures during processing, testing and soldering. Accordingly, it is important that the package be able to withstand high temperatures without inhibiting or degrading electrical performance. Water or moisture in a package can cause a breakdown in package electrical performance. Thus, care must be exercised during processing to prevent moisture absorption during processing.

It would be desirable to provide an integrated circuit package which allows an integrated circuit to operate at the performance level intended by the circuit designer. It would further be desirable to provide such a package which is both very reliable, easy to handle and is capable of dissipating thermal energy generated by an integrated circuit operating at a high frequency. It would further be desirable to provide a package that does not require the modification of metallurgies or the addition of metal layers to standard semiconductors. It would further be desirable to provide a package that can utilize the existing wire bond assembly infrastructure. It would also be desirable to provide such an integrated circuit package which absorbs less moisture during fabrication.

SUMMARY OF THE INVENTION

Briefly stated, the present invention is directed to a package for an integrated circuit chip which provides a number of improved operating properties over presently available packages. The package of the present invention provides: high density wiring and via formation; close coupled power and ground layers; a single conductive layer through which all data signals are routed; short wire bond lengths; very little moisture absorption; and good heat dissipation characteristics. The properties of the present invention are achieved through the use of a unique combination of materials and structure in layered relation.

In its basic form, the integrated circuit package of the present invention houses an integrated circuit chip and provides electrical connectivity of data signals and voltage signals between the integrated circuit chip and an electronic component, such as a printed circuit board. The package comprises a carrier substrate having a first surface including a die attach region and a signal layer region. An integrated circuit chip having a plurality of bonding pads is affixed to the die attach region of the substrate. The package has at least three conductive layers on the signal layer region of the substrate for conducting electrical signals. The conductive layers comprises a signal layer for routing all of the data signals and at least a first voltage layer for providing a first reference voltage signal to the integrated circuit chip and a second voltage layer for providing a second reference voltage signal to the integrated circuit chip. A plurality of dielectric layers separate the conductive layers from each other and a plurality of electrical connections interconnect the chip bonding pads with the electronic component by way of at least one of the conductive layers for conducting electrical signals therebetween.

In a preferred embodiment, the integrated circuit package of the present invention comprises a carrier substrate having a first surface including a die attach region, a signal layer region and an outer perimeter. An integrated circuit chip having a plurality of bonding pads is affixed to the die attach region of the substrate. Again, at least three conductive layers are affixed, in layered relation to one another, on the signal layer region of the substrate for conducting electrical signals. The conductive layers comprise a signal layer and at least a first voltage layer for providing a first reference voltage signal to the integrated circuit chip and a second voltage layer for providing a second reference voltage signal to the integrated circuit chip, wherein all of the data signals are routed on the signal layer. The first and second voltage layers comprise power and ground layers. The power and ground layers are closely coupled to provide low power to distribution impedance. A plurality of dielectric layers are provided for separating the conductive layers from each other and a plurality of wire bonds interconnect the chip bonding pads with the signal layer for conducting electrical signals therebetween. An encapsulant may be formed around the integrated circuit chip and the wire bonds to encapsulate the integrated circuit chip and the wire bonds. A first plurality of interconnect vias between the signal layer and the voltage layers provide electrical connectivity between the voltage layers and the signal layer located adjacent to the integrated circuit chip and a plurality of package leads electrically connected to the signal layer provide electrical connectivity between the electronic component and the package. A second plurality of interconnect vias between the signal layer and the voltage layers provide electrical connectivity between the package leads and the first and second voltage layers, and are located proximate to the outer perimeter of the substrate.

In another preferred embodiment of the present invention, the integrated circuit package comprises a carrier substrate having a first surface including a die attach region and a signal layer region. An integrated circuit chip is affixed to the die attach region, the integrated circuit chip including a plurality of bonding pads. At least three conductive layers on the signal layer region of the substrate are provided for conducting electrical signals, the conductive layers comprising at least a first voltage layer adjacent to the substrate for providing a first reference voltage signal to the integrated circuit chip, a second voltage layer for providing a second reference voltage signal to the integrated circuit chip, and a signal layer, wherein all of the data signals are routed on the signal layer. A plurality of dielectric layers are provided for separating the conductive layers from each other, wherein the dielectric layer separating the second voltage layer and the signal layer comprises cyanate ester impregnated expanded polytetrafluoroethylene. A plurality of electrical connections are provided for interconnecting the chip bonding pads with the electronic component by way of at least one of the conductive layers for conducting electrical signals therebetween.

BRIEF DESCRIPTION OF THE DRAWINGS

The foregoing summary, as well as the following detailed description of preferred embodiments of the invention, will be better understood when read in conjunction with the appended drawings. For the purpose of illustrating the invention, there is shown in the drawings embodiments which are presently preferred. It should be understood, however, that the invention is not limited to the precise arrangements and instrumentalities shown. In the drawings:

FIG. 5 is a greatly enlarged, broken-away cross-section view of a portion of the integrated circuit package of FIG. 4 having three conductive layers;

FIG. 7 is a greatly enlarged, broken-away cross-section view of a portion of the integrated circuit package of FIG. 1 in accordance with the present invention;

FIG. 8 is an enlarged cross-section view of a land grid array carrier; and

FIG. 9 is a cross-section view with a substrate larger than the circuit area.

DETAILED DESCRIPTION OF THE INVENTION

Figure 1:
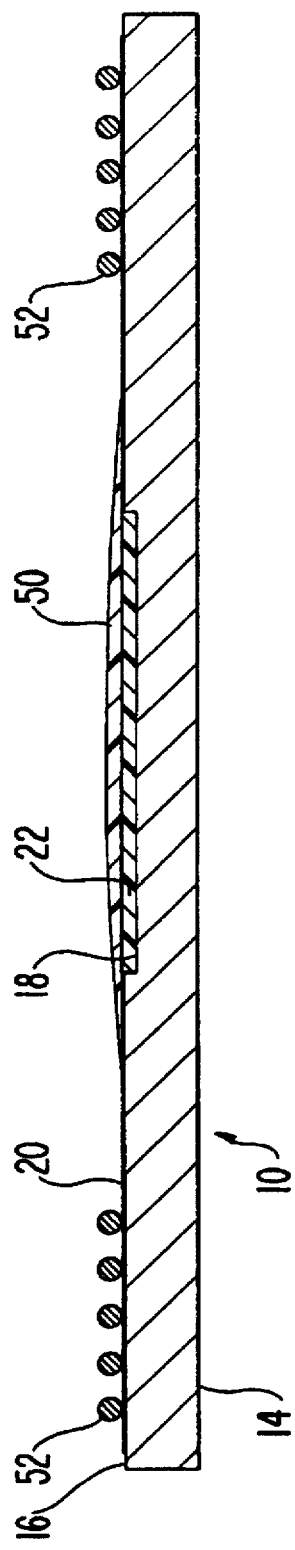
FIG. 1 is an enlarged cross-section view of an integrated circuit package in accordance the present invention.

Certain terminology is used in the following description for convenience only and is not limiting. The words "inwardly" and "outwardly" refer to directions towards and away from, respectively, the geometric center of the integrated circuit package and designated parts thereof. The words "upper" and "lower" refer to directions on opposing sides of the package and designated parts thereof. The terminology includes the words specifically mentioned, derivatives thereof and words of similar import.

Note also, for simplicity and clarity, elements shown in the FIGS. are not necessarily drawn to scale. For example, the dimensions of some of the elements are exaggerated relative to each other for clarity.

Although integrated circuit packages are known and have been used for many years, no known integrated circuit packages have used the unique combination of materials and features employed in the present invention. The preferred embodiments of the present invention combine a polytetrafluoroethylene (PTFE) composite dielectric layer with electrically conductive power, ground, and signal layers. This combination has been found to yield surprisingly good results for providing an integrated circuit package which absorbs less water, allows for closely coupled power and ground layers, and allows for the implementation of high density wiring and via formation. Further, by limiting routing of all data signals to a single layer and providing separate layers for power and ground, the package exhibits excellent electrical characteristics. Thermal spreading is accomplished by providing a thermal spreader attached to a substrate of the package. Other improvements over known semiconductor packages will also become apparent from the description of the present invention provided below.

Referring now to the drawings in detail, wherein like numerals indicate like elements throughout, there is shown a presently preferred embodiment of an integrated circuit package, indicated generally at 10. The package 10 houses an integrated circuit chip 22 and provides electrical connectivity of data signals and voltage signals between the chip 22 and an electronic component. The electronic component is typically a printed circuit board (PCB) populated with a plurality of other electronic devices.

The package 10 comprises a carrier substrate 14 having a first surface 16 including a die attach region 18 and a signal layer region 20. Suitable substrate materials may be a rigid substrate or a flexible film, such as is normally used and known by those of ordinary skill in the art. For example, substrate materials such as ceramic, silicon, silicon dioxide, metal, or reinforced plastic with thermal vias (e.g., glass reinforced epoxy, glass reinforced polyimide, glass reinforced polyester, glass reinforced PTFE, polyimide, polyester, and other high temperature thermoplastics, alone or in conjunction with glass or other reinforcing materials or metal cladding) may be used. Other material properties for the substrate 14 will be discussed in greater detail below.

The integrated circuit chip 22 is affixed to the die attach region 18 of the substrate 14. A variety of IC chips 22 may be used with the package 10 of the present invention, although the package 10 is more specifically directed for use with high performance IC chips which include a plurality of bonding pads 24 for electrically connecting the chip 22 to the package 10, such as full-custom application specific integrated circuits (ASICs), semi-custom ASICs, and other high performance IC chips. The types of IC chip 22 is generally of the type which comprises a die cut from a silicon wafer. This type of IC chip 22 is generally well known to those of ordinary skill in the art.

Generally, the die attach region 18 is centrally located on the first surface 16 of the substrate 14 and is surrounded by the signal layer region 20. As shown in FIG. 1, in a preferred embodiment of the present invention, the die attach region 18 comprises a cavity recessed in the first surface 16 of the substrate 14. The cavity is very precisely cut or formed in the substrate 14 by molding, photo-etching, or routing, and is sized to be only very slightly (20-50 mils) larger or oversized than the chip 22 so that electrical interconnects between the chip 22 bonding pads 24 and the signal layer region 20 are of minimal length. An alternate method of forming the cavity is to form it in the stiffener ring 54 by photo-etching routing or punching and then bonding the ring to the substrate 14 to form the cavity. The chip 22 is also very precisely aligned and placed within the cavity before being affixed to the die attach region 18. The package 10 is not limited to any particular size chip 22, and can be constructed to house chips which range in size, for instance, from 5 mm to 20 mm square. Although many chips are square, it will be apparent to those of ordinary skill in the art that differently shaped chips can also be housed in the package 10 of the present invention.

The chip 22 is affixed to the die attach region 19 so that the chip 22 is mechanically secure and will not move or come loose, which could cause damage to the electrical connections between the chip 22 and the package 10. A die attach adhesive 26, such as a conductive liquid epoxy can be used to affix the chip 22 to the die attach region 18, as is known by those of ordinary skill in the art or other die bond methods can be used to attach the chip 22 to the substrate 14. However, in the presently preferred embodiment of the invention, the die attach adhesive 26 is a thermally and electrically conductive thermoplastic adhesive, such as Staystik™ available from Alpha Metals Co. of Jersey City, N.J. Conductive adhesives have conductive particles suspended in the adhesive. A thermoplastic adhesive is used because, while the adhesive melts, it is viscous, and therefore, it does not flow out and around the chip 22 and cover the chip bond pads 24. Other thermoplastic adhesives which can be used to secure the chip 22 to the substrate 14 are disclosed in U.S. patent application Ser. No. 08/196,048 filed Feb. 14, 1994, which is incorporated herein by reference. Thus, by attaching the chip 22 within a precisely formed and sized cavity within the substrate 14, the lengths of interconnects between the chip bond pads 24 and the package 10 are minimized.

Figure 2:
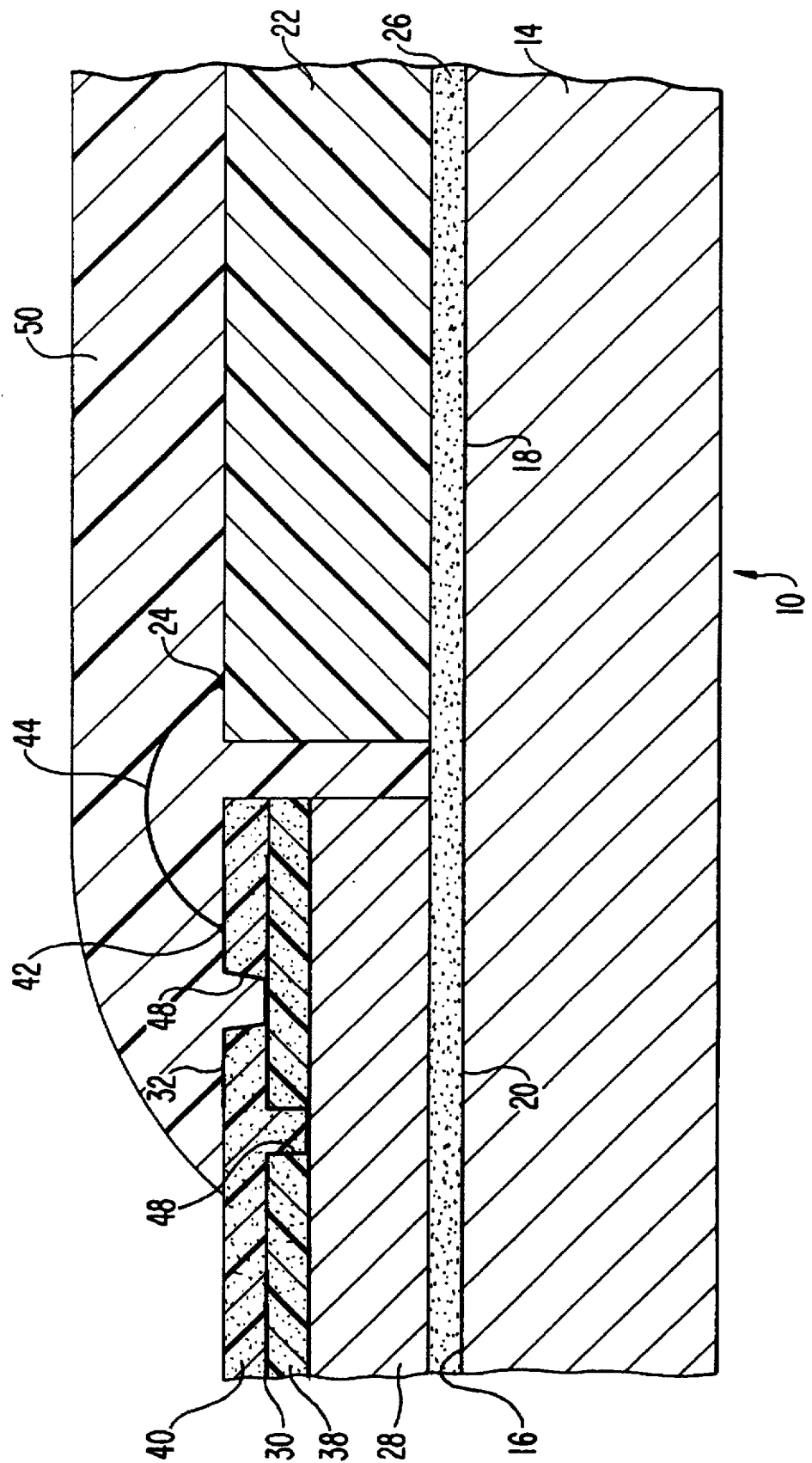
FIG. 2 is a greatly enlarged, cross-section view of a portion of an integrated circuit package having three conductive layers in accordance with the present invention.
Figure 3:
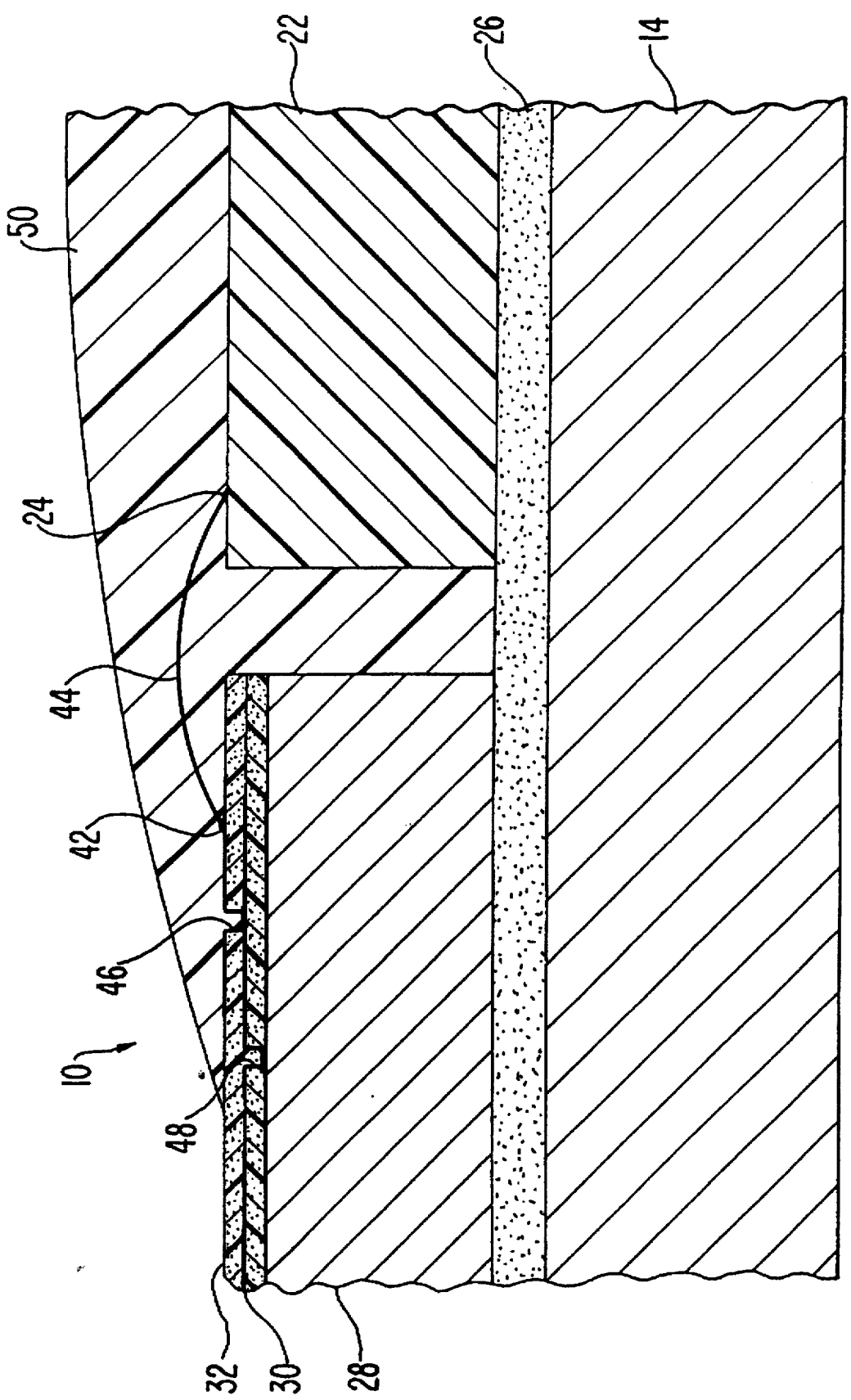
FIG. 3 is a greatly enlarged, broken-away cross-section view of a portion of the integrated circuit package of FIG. 1 having three conductive layers in accordance with the present invention.

Referring now to FIGS. 2, 3 and 7, the package 10 further comprises at least three conductive layers on the signal layer region 20 of the substrate 14 for conducting electrical signals. The conductive layers comprise at least a first voltage layer 28 for providing a first reference voltage signal to the chip 22 and a second voltage layer 30 for providing a second reference voltage signal to the chip 22 and a signal layer 32 for providing data signal connectivity to the chip 22. In the presently preferred embodiment, the first reference voltage layer 28 is a reference ground layer or plane located adjacent and attached to the substrate 14 signal layer region 20 for providing a ground signal to the chip 22. The first voltage layer 28 is attached to the substrate 14 with an electrically conductive thermoplastic, such as the thermoplastic adhesive 26 used to attach the chip 22 to the substrate 14. Indeed, as shown in FIG. 2, the same adhesive 26 is used to attach the first voltage layer 28 to the substrate 14 as is used to attach the chip 22 to the substrate 14. Alternatively, the first voltage layer 28 can also be formed integral with the substrate 14 (FIG. 3) instead of being attached by an adhesive. The first voltage layer 28 is constructed of a conductive material, metal or metal alloy, which in the preferred embodiment is preferably a metal, such as, but not limited to copper, gold, silver, nickel, aluminum, or an alloy thereof and is approximately 25–500 microns in thickness for the ring thickness. These metals are preferred because of their superior thermal and electrical conductive properties. However, other conductive materials, metals and metal alloys known to those of ordinary skill in the art can also be used, such as Copper Invar Copper.

The second voltage layer 30 comprises a plane parallel to the first voltage layer 28 and in the preferred embodiment, provides a reference voltage level to chip 22, such as a 3.3 V or 5 V power signal commonly used by integrated circuits, such as chip 22, and is constructed of a conductive material, metal or metal alloy, which in the preferred embodiment is preferably a metal, such as, but not limited to copper, gold, silver, nickel, aluminum, or an alloy thereof and is approximately 1–25 microns in thickness. The second voltage layer 30 (power) is closely coupled to the first voltage layer 28 (ground) for providing a significant level of decoupling capacitance of at least 0.05 nF/cm$^2$. One benefit of the increased decoupling capacitance is that it allows for more simultaneous switching of data signals on the signal layer 32 without compromising the individual signal integrity of the data signals or requiring specialized routing of data signals to prevent the effects of simultaneous switching on signal lines on the signal layer 32.

The signal layer 32 comprises a conductive material layer which lies in a plane parallel to the first and second voltage layers 28, 30. The signal layer 32 provides a conductive layer for routing all of the data signals to and from the chip 22 within the package 10. Similar to the other conductive layers 28, 30, the signal layer 32 is constructed of a conductive material, metal or metal alloy, which in the preferred embodiment is copper or copper-nickel-gold and is approximately 1–25 microns in thickness. The data signals are patterned on the signal layer 32 through any suitable technique, such as by subtractive, additive, semiadditive, or lift-off techniques. Thus, in summary, the first conductive layer 28 is the grounding layer, the second conductive layer 30 is the supply voltage layer, and the third conductive layer 32 is the signal layer.

Figure 6:
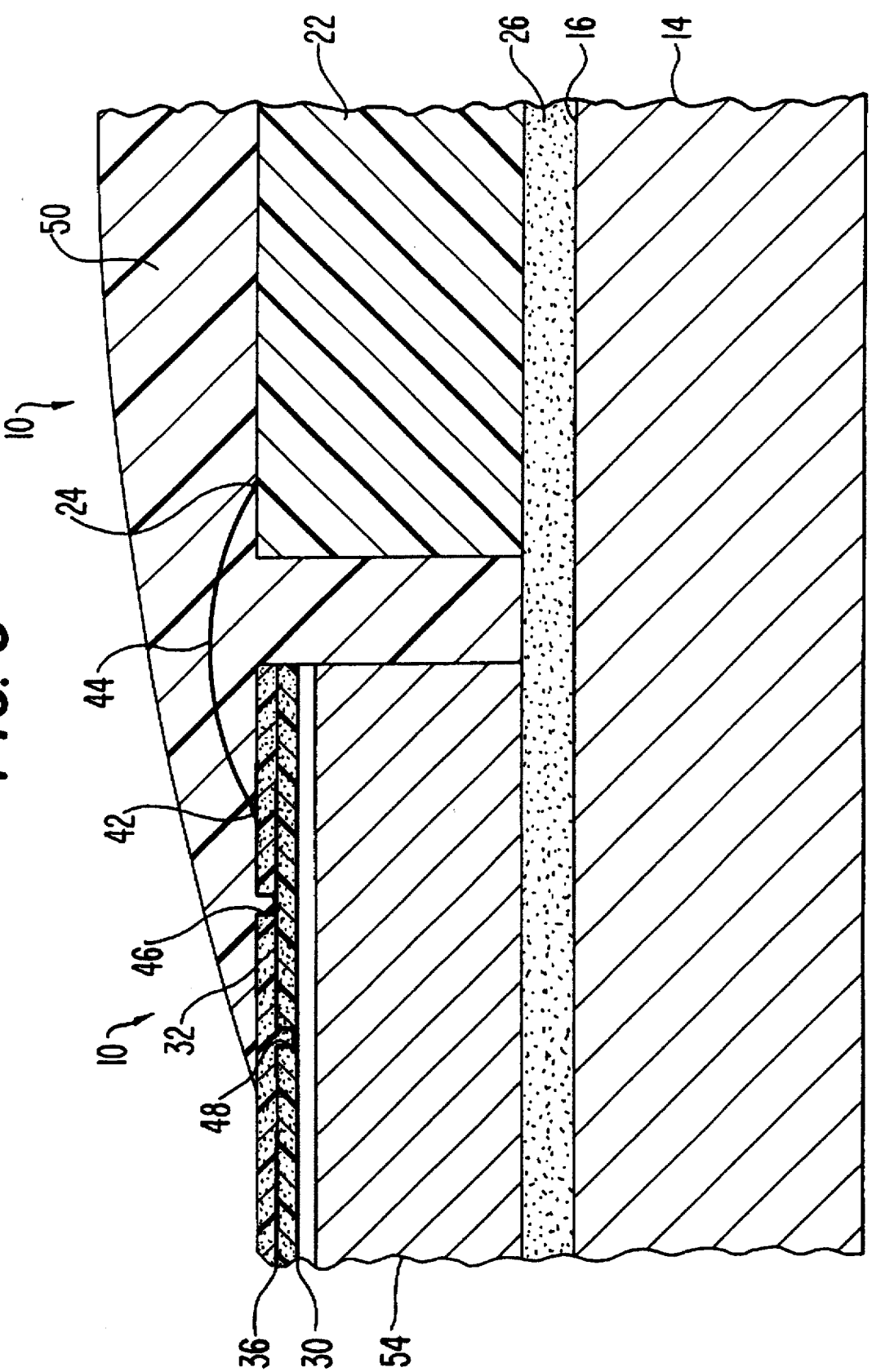
FIG. 6 is a greatly enlarged, broken-away cross-section view of a portion of the integrated circuit package of FIG. 4 having four conductive layers.

In an alternative preferred embodiment, the package 10, as shown in FIG. 6, includes a fourth conductive layer 36 located between the signal layer 32 and the first voltage layer 28. The fourth conductive layer 36 is used as a third voltage layer and comprises a plane parallel to the first and second voltage layers 28, 30 and is used to provide a reference voltage level to chip 22, such as a 3.3 V or 5 V power signal. This embodiment of the package 10 is used for providing two different voltages (e.g. 3.3 V and 5 V) to an IC chip which requires or operates using two different voltage signals in addition to ground. The fourth conductive layer 36 is constructed of a conductive material, metal or metal alloy, which in the preferred embodiment is a metal, such as, but not limited to copper, gold, silver, nickel, aluminum, or an alloy thereof and is approximately 1–25 microns in thickness.

Although the remaining description of the present invention is generally described in reference to a three conductive layer package, it should be understood that a fourth conductive layer 36 for providing a second power signal to an IC chip or other layers may be provided and constructed through any conventional method. Thus, a package 10 according to the present invention can have four conductive layers, in which one layer 28 comprises a first reference voltage layer, such as a ground plane, one layer 30 comprises a second reference voltage layer, one layer 36 comprises a third reference voltage layer and one layer 32 comprises a signal routing layer. Such a package 10 supports an IC chip 22 which, for instance, uses both 3.3 V and 5 V signals and prevents or limits degraded 5 V signals. Although current mixed voltage parts generally operate using both 3.3 V and 5 V signals, it will be apparent to those of ordinary skill in the art that other voltage level signals can be mixed and that the present invention can be used to house IC chips which operate using different mixed voltage levels.

The package 10 further comprises a plurality of dielectric layers for separating the conductive layers from each other. A first dielectric layer 38 separates the first voltage layer 28 (ground) from the second voltage layer 30 (power). In the presently preferred embodiment, the first dielectric layer 38 between the first and second voltage layers 28, 30 has a generally high dielectric constant, the constant being in a range from 8 to 25, for providing increased decoupling capacitance between the first and second voltage layers 28, 30. Many materials provide adequate electrical characteristics and material strength for the dielectric layer 38 separating the first and second voltage layers 28, 30. In the presently preferred embodiment, the first dielectric layer 38 is a fluoropolymer based material, such as a cyanate ester, barium titanate, or titanium dioxide filled expanded polytetrafluoroethylene (PTFE) membrane which ranges in thickness from approximately 12 microns to 75 microns. Expanded PTFE is described in U.S. Pat. No. 3,953,566 to Gore, which is incorporated herein by reference.

A second dielectric layer 40 separates the second voltage layer 30 (power) from the signal layer 32. In the presently preferred embodiment, the second dielectric layer 40 has a generally low dielectric constant, the constant being in a range from 2.5 to 3.2, for providing reduced time of flight on the signal layer 32. Many materials, such as epoxy/glass, polyimide/glass, and photoimageable epoxies provide adequate electrical characteristics and material strength for the dielectric layer 40 separating the second voltage layer 30 and the signal layer 32. Although newly available polyimide dielectrics have low coefficients of thermal expansion to match silicon or alumina substrate materials and low outgassing and high thermal stability characteristics to allow for use in hermetically-sealed packages, the dielectric constant of these materials is still generally greater than 3.2. In the presently preferred embodiment, the second dielectric layer 40 is fluoropolymer based material, and is preferably constructed of a cyanate ester filled expanded polytetrafluoroethylene (PTFE) membrane which has a dielectric constant of approximately 2.6 or a silicon dioxide filled expanded PTFE membrane which has a dielectric constant of approximately 2.9. Preferably the second dielectric layer 40 ranges in thickness from approximately 12 microns to 50 microns.

The use of PTFE dielectric layers allows the power and ground layers 28, 30 to be very closely coupled, since the PTFE can be formed into very thin layers (less than 5 microns), thereby providing significantly lower inductance bond paths compared to present peripheral bonded chip packages. The lower inductance allows the IC chip 22 to be operated at very high frequencies. As previously discussed, plastic packages are subject to moisture absorption problems. In addition, some dielectric materials are hydrophilic, requiring dehydration processes and other measures to ensure long term product reliability. Since PTFE has low water absorption, reliability problems caused by water absorption and retention are minimized. Moreover, the elasticity of the fluoropolymer-based material dielectric layers 38, 40 allows the package 10 to accommodate mechanical stresses between the substrate 14 and the chip 22, such as pressure on the chip 22 during socketing. This helps to relieve some of the stress due to the difference in CTE between the chip 22 (e.g., silicon) and the electronic component (e.g., FR-4 printed circuit boards). The first and second dielectric layers 38, 40 are laminated or similarly affixed to the first voltage layer 28 and the second voltage layer 30, respectively, during fabrication of the package 10.

The package 10 further comprises a plurality of electrical connections for interconnecting the IC chip 22 bonding pads 24 with the electronic component by way of at least one of the conductive layers 28, 30, 32, 36 for conducting electrical signals therebetween. In the presently preferred embodiment, the chip bonding pads 24 are each electrically connected to a signal layer bonding pad 42 on the signal layer 32 by bond wires 44. Of course, it will be understood by those of ordinary skill in the art that every chip bonding pad 24 might not be used, since it is common that some of an IC chip's pads are not used, or that some of the IC chip pads are used only as test points when testing the chip while it is still on the wafer to choose good die, prior to installing the chip 22 in a package, such as the package 10 of the present invention. The bond wires 44 are constructed of a highly conductive material, such as gold or aluminum. By providing very short wire lengths, the package 10 has decreased parasitic capacitance and inductance, thereby increasing signal bandwidth. It is well known to those of ordinary skill in the art how to wire bond from a chip pad to a signal layer pad, accordingly, this process will not be described in further detail herein.

The signal layer bonding pads 42 on the signal layer 32 are connected to signal traces on the signal layer 32 or, for power and ground signals, the signal layer bonding pad 42 is connected to either the second voltage layer 30 or the first voltage layer 28, respectively, by vias 46 extending between the signal layer 28 and the second voltage layer 30 and vias 48 between the second voltage layer 30 and the first voltage layer 28. The vias 46, 48 used to interconnect the conductive layers 28, 30, 32 are approximately 25 microns in diameter. By providing vias 46, 48 of such a diameter allows for very high density routing of signals on the signal layer 32. Because the package 10 provides for very short bond wires 44, the package 10 provides significant performance advantages, such as reduced signal inductance. The wire bond inductance of the package 10 is less than about 1 nH and greater than about 0.25 nH; (Wire bond inductance for an integrated circuit wire bond package can be readily determined by using a Partial Element Equivalent Circuit (PEEC) method of analysis, when the effect of neighboring wire bond conductors is to be considered in determining wire bond inductance. Three dimensional inductance modeling systems, which employ the (PEEC) method, are conventionally employed to determine wire bond inductance for an integrated circuit wire bond package, such as PLANE™ software for three dimensional inductance modeling from CONTEC Microelectronics, Inc.). In addition, by providing a separate layer 32 for routing all of the data signals to/from the IC chip 22, the signal layer 32 allows and uses high density routing/tracing of data signals. Individual signal traces on the signal layer 32 are approximately 25 microns in width and spaced from adjacent signal lines by approximately 25 microns. By providing for high density wiring on the signal layer 32, the signal layer bonding pads 42 are spaced relatively close together and adjacent to the chip bonding pads 24. Accordingly, there is little variation between the pitch of the pads 24 on the IC chip 22 and the pitch of the pads 42 on the signal layer 32. This is an important factor in minimizing the length of the bond wires 44, which, as previously discussed, decreases signal propagation delay. The conductive layers may be interconnected by vias through conventional methods.

In the presently preferred embodiment, the package 10 further comprises an encapsulant 50, preferably formed over the IC chip 22, the bond wires 44 and at least a portion of the signal layer 32 to encapsulate the IC chip 22 and the bond wires 44. The encapsulant 50 protects the IC chip 22 and the delicate bond wires 44 from physical and environmental damage. The encapsulant 50 is preferably a low modulus plastic which is overmolded over the IC chip 22 and the bond wires 44. Silicone, epoxy, silicone-epoxy resins and similar materials can be used and are known by those of ordinary skill in the art.

A second plurality of interconnect vias, similar to the first plurality of interconnect vias 46, 48, are provided for electrically connecting the first and second voltage layers 28, 30 to the signal layer 32 for electrically contacting a plurality of package leads 52. The second plurality of interconnect vias, in the presently preferred embodiment, are located adjacent to an outer perimeter of the substrate 14 and proximate the package leads 52. The second plurality of vias are provided for electrically connecting a selected predetermined plurality of the package leads 52 to the first and second voltage layers 28, 30 in order to provide electrical connectivity between the package leads 52 and the IC chip 22. The second plurality of vias are sized, shaped and formed similar to the first plurality of vias 46, 48 and are approximately 25 microns in diameter. In the preferred embodiment, the package 10 employs vias only for connecting to the power and ground layers 30, 28 and eliminates the use of signal vias entirely by restricting signal routing to the signal layer 32 itself.

Figure 4:
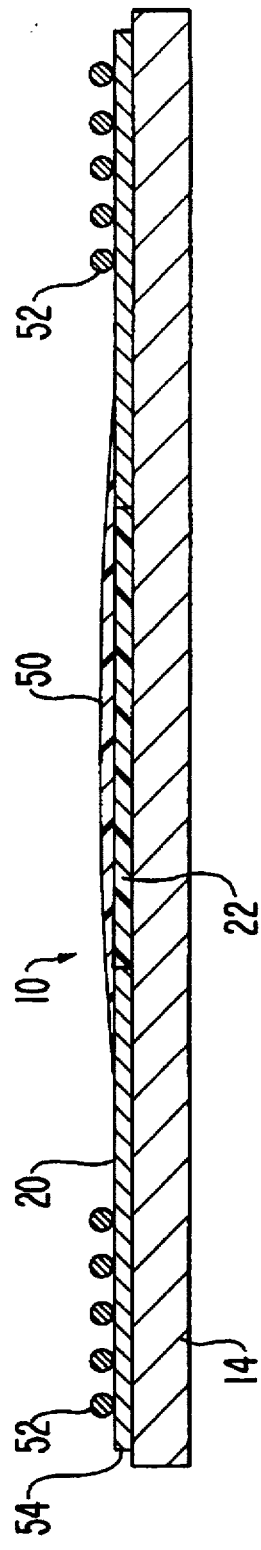
FIG. 4 is an enlarged cross-section view of an integrated circuit package including a stiffener ring in accordance the present invention.

The package leads 52 provide electrical connectivity between the package 10 and the electronic component, which is generally a printed circuit board. In a first presently preferred embodiment of the invention, as shown in FIGS. 1 and 4, the package leads 52 comprise a ball grid array (BGA), in which solder balls are attached in an area array configuration on the signal layer 32, preferably proximate the outer perimeter of the signal layer 32 and the package 10. BGAs are known to enable better ways to produce high pin count devices in a small footprint. For instance, the package 10 can be used to house 0.5-micron CMOS ASICs with I/O counts ranging from under 100 to greater than 500. Thus, it should be understood by those of ordinary skill in the art that a variety of IC chips 22 can be housed in the package 10, and the package 10 is not limited to housing any particular circuit type, such as CMOS or gallium arsenide circuits. The solder balls can be constructed of a 90% Pb—10% Sn solder alloy, 63% Pb—37% Sn, Tin-Bismuth, or other typical interconnect metallurgy. A 90% Pb—10% Sn solder alloy used for a BGA does not melt and collapse during typical surface mount assembly and provides for good attachment reliability. Further, 90% Pb—10% Sn solder is more fatigue-resistant than eutectic and near-eutectic (e.g., 62% Sn—36% Pb—2% Ag) solder. Solder balls can be reflow soldered directly to any substrate using conventional surface mount processes. The nominal diameter of the solderable surface of a solder pad used in a BGA is generally from 23 to 25 mils or greater for a plastic BGA and 28.5 mils for a ceramic BGA. The difference in diameters is because ceramic BGAs tend to employ a larger diameter solder ball (typically 35 mils for ceramic BGA, compared to 30 mils for plastic BGA) to give it an increased board mounted joint standoff height. The package 10 can also use low profile (150 micron) solder bumps or other conventional BGA solder balls. Bump pitch (i.e., minimum bump-to-bump distance) is in the range of 0.5 to 1.5 mm. Solder bumps can be reflow-soldered to ordinary FR-4 printed circuit boards, using standard pick-and-place assembly equipment and IR energy, vapor phase, or hot-gas soldering techniques.

The plastic BGA solder joint has a 179° C. to 183° C. solidus (melt temperature) and collapses approximately 10 mils during reflow. The collapsing ball, along with solder paste applied to the electronic component (i.e., the PCB) prior to package 10 placement for surface-mount assembly, accommodates for some package warpage associated with the PBGA. Current Jedec standards prescribe BGA coplanarity to be 0.15 mm (5.91 mils) or better in the registration for ceramic or plastic BGAs. The forgiveness of a collapsing joint is not necessary in the case of a CBGA, where the flatness of the ceramic body is usually well within the Jedec guideline. Besides providing an electrical connection to the electronic component, BGA solder joints are the complete means of mechanical attachment. The array of balls on the BGA package 10 ultimately absorbs all the differential thermal expansions between the package 10 and the electronic component during application of thermal-cycling temperature excursions. The differential expansions are the result of dissimilar package 10 and electronic component (PCB) material coefficients of thermal expansion and temperature gradients within the package 10. For a plastic BGA, the material that is the main source of mismatch is the silicon IC 22 itself, which has an expansion coefficient almost an order of magnitude lower than most of the other materials that make up the package, such as BT/glass, PBGA substrate, mold compound, FR-4/glass, copper and solder. For that reason, the solder joints under the die or circuit exhibit the most strain and have been shown to fail first in thermal cycling. Solder joint reliability is also proportional to the die size. The source of the expansion mismatch for a ceramic BGA is the ceramic body itself, which has about one-quarter to one-half the expansion coefficient of the typical printed circuit board onto which it is mounted. On the ceramic BGA, solder joint failure occurs first on joints that are farthest away from the package center.

The present invention provides package enhancements which lessen the effect of the silicon mismatch in conventional plastic BGA packages and reduce the solder joint fatigue in ceramic BGA packages without increasing the stand-off height of the solder bumps. The cavity down design eliminates the possibility of solder balls under the die. Special high lead solder bumps or columns are not required because CTE mismatch stresses are relieved by the selection of substrate material with a CTE closer to the printed circuit board. This allows for a low stress package to board interface and virtually eliminates the possibility of solder-attached cracking failures, which are typical problems caused by CTE mismatches between the substrate 14 and the printed circuit board. This allows the package 10 to be used for larger die than conventional plastic BGA packages and larger package sizes than ceramic.

In a second preferred embodiment, the package leads 52 comprise a land grid array. As shown in FIG. 8, a land grid array is similar to a ball grid array except that interconnection between the package 10 and the electronic component are provided by sockets, elastomeric connectors, or other methods, instead of by reflowed solder balls.

The layout of the package leads 52 are not constrained by the package 10 of the present invention and can be optimally configured for reliable performance and assembly yield. For instance, contact pads can be spaced 50 mils (1.27 mm) apart or closer.

The packaging material is also an important factor in heat dissipation. Since high performance ICs dissipate a significant amount of power, the package has to supply a good thermal path to remove the heat generated. Excess temperature of the IC can degrade circuit electrical performance or cause premature failure of the IC or package. The poor heat transfer characteristic of most plastics limit heat dissipation. Ceramic has better heat transfer than the plastic packages, but is not as conductive as many of the substrate choices available to package 10. The package 10 of the present invention allows for significant thermal dissipation by employing a material for the substrate 14 which conducts heat, such as copper, copper (20%)-invar (60%)-copper (20%), copper (20%)-molybdenum(60%)-copper(20%), aluminum, alumina, aluminum nitride, silicon carbide, mullite, cordierite, invar (100%), molybdenum, silicon, or like materials. If required to provide additional surface area to a heat sink, substrate 14 can exceed the area of the signal area. An example of this construction is shown in FIG. 9.

In a preferred embodiment, the substrate 14 comprises a thermal spreader and because the IC chip 22 is attached directly to the substrate 14, preferably by the thin thermally conductive thermoplastic adhesive 24, heat generated by the IC chip 22 travels away from the chip 22 through the substrate 14. In the presently preferred embodiment, the thermal spreader is constructed of copper because copper is CTE matched to the printed circuit board while providing excellent heat dissipation. Further, a heat sink could be attached to the package 10 to enhance heat dissipation.

Alternatively, since differences in CTE between the IC chip 22 and the substrate 14 can cause enormous shear forces, which lead to cracking of the die, the material of the substrate 14 can be chosen so that the CTE of the substrate 14 approximates the CTE of the IC chip 22, such as aluminum nitride, silicon carbide, mullite, cordierite, silicon, or like materials. Alternatively, the material of the substrate 14 can be chosen such that the CTE of the substrate 14 is intermediate to the value of the CTE of the electronic component and the CTE of the IC chip 22.(e.g., copper (20%)-invar (60%)-copper(20%), copper (20%)-molybdenum(60%)-copper(20%) or like materials) Further, in addition to providing thermal dissipation, a metal substrate can be used as an active ground plane to suppress EMI noise.

One of the problems with laminated packages is that they tend to warp when subjected to heat. In order to prevent warping, as shown in FIGS. 4-6, the conductive layers 28, 30, 32 can be fabricated on a stiffener ring 54 prior to being attached to the substrate 14. The stiffener ring 54 can be constructed from a material which has a high flex modulus, such as copper, copper (20%)-invar (60%)-copper(20%), copper (20%)-molybdenum(60%)-copper(20%), aluminum, alumina, aluminum nitride, silicone carbide, mullite, cordierite, invar (100%), molybdenum, silicon, or like materials and is preferably the same composition of the substrate 14.

From the foregoing description, it can be seen that the preferred embodiments of the invention comprise an integrated circuit package 10 which exhibits excellent electrical performance characteristics. The integrated circuit package 10 is ideally suited for housing high I/O count IC chips which operate at high frequencies. The package 10 minimizes lead and total package inductance, as well as provides significant decoupling capacitance. In addition, the package 10 provides excellent thermal dissipation. Package 10 reliability is very good due to the ability to match the package CTE to the IC chip 22 CTE. Moreover, it is clear that packages 10 according to the present invention may be fabricated using a variety of I/O methodologies (e.g., ball grid array, land grid array) and accordingly, the present invention should not be specifically limited to any particular I/O type package.

It will be appreciated that changes and modifications may be made to the above described embodiments without departing from the inventive concept thereof. Therefore, it is understood that the present invention is not limited to the particular embodiment disclosed, but is intended to include all modifications and changes which are within the scope and spirit of the invention as defined by the appended claims.

We claim:

1. An integrated circuit package for housing an integrated circuit chip and for providing electrical connectivity of data signals and voltage signals between the integrated circuit chip and an electronic component, the package comprising:

a carrier substrate having a first surface including a die attach region and a signal layer region;

an integrated circuit chip affixed to the die attach region, the integrated circuit chip including a plurality of bonding pads;

at least three conductive layers on the signal layer region of the substrate for conducting electrical signals, the conductive layers comprising a single signal layer, at least a first voltage layer for providing a first reference voltage signal to the integrated circuit chip and a second voltage layer for providing a second reference voltage signal to the integrated circuit chip, the first voltage layer comprising a reference ground layer adjacent to the substrate for providing a ground signal to the integrated circuit chip and the second voltage layer comprising a reference voltage layer closely coupled to the reference ground layer thereby providing a decoupling capacitance of at least 0.05 nF/cm$^2$ therebetween;

a plurality of bond wires having a predetermined length, each bond wire electrically connecting a single bonding pad of the integrated circuit chip to a single bonding pad of the signal layer, each bond wire being disposed substantially parallel one to each other to route all of the data signals on the single signal layer to minimize the length of the bond wires, the bond wire inductance being in a range from about less than 1 nH to about greater than 0.25 nH;

at least first and second dielectric layers, the at least first dielectric layer being disposed between the first and second voltage layers, and the at least second dielectric layer being disposed between the second voltage layer and the signal layer; and a plurality of electrical connections for interconnecting the chip bonding pads with the electronic component by way of at least one of the conductive layers for conducting electrical signals therebetween.

2. An integrated circuit package for housing an integrated circuit chip and providing electrical connectivity of data signals and voltage signals between the integrated circuit chip and an electronic component, the package comprising:

a carrier substrate having a first surface including a die attach region and a signal layer region;

an integrated circuit chip affixed to the die attach region, the integrated circuit chip including a plurality of bonding pads;

at least three conductive layers on the signal layer region of the substrate for conducting electrical signals, the conductive layers comprising at least a first voltage layer adjacent to the substrate for providing a first reference voltage signal to the integrated circuit chip, a second voltage layer for providing a second reference voltage signal to the integrated circuit chip, and a single signal layer, the first voltage layer comprising a reference ground layer adjacent to the substrate for providing a ground signal to the integrated circuit chip and the second voltage layer comprising a reference voltage layer closely coupled to the reference ground layer thereby providing a predetermined significant level of decoupling capacitance therebetween;

a plurality of bond wires having a predetermined length, each bond wire electrically connecting a single bonding pad of the integrated circuit chip to a single bonding pad of the signal layer, each bond wire being disposed parallel one to each other to route all of the data signals on the single signal layer to minimize the length of the bond wires, the bond wire inductance being in a range from about less than 1 nH to about greater than 0.25 nH;

at least first and second dielectric layers, the at least first dielectric layer being disposed between the first and second voltage layers, and the at least second dielectric layer being disposed between the second voltage layer and the signal layer, wherein the second dielectric layer comprises at least in part cyanate ester impregnated expanded polytetrafluoroethylene; and a plurality of electrical connections for interconnecting the chip bonding pads with the electronic component by way of at least one of the conductive layers for conducting electrical signals therebetween.

3. A high performance integrated circuit package for housing an integrated circuit chip and for providing electrical connectivity of data signals and voltage signals between the integrated circuit chip and an electronic component, the high performance integrated circuit package permitting an integrated circuit chip to operate at predetermined high frequencies, the high performance integrated circuit package comprising:

a carrier substrate having a first surface including a die attach region and a signal layer region;

an integrated circuit chip having predetermined dimensions and being affixed to the die attach region, the integrated circuit chip including a plurality of bonding pads;

at least three conductive layers on the signal layer region of the substrate for conducting electrical signals, the conductive layers comprising:

a) a single signal layer having a plurality of signal bonding pads and signal traces, the single signal layer routing all of the data signals to and from the integrated circuit chip, the single signal layer using high density routing and tracing of the data signals;

b) at least a first voltage layer for providing a first reference voltage signal to the integrated circuit chip; and c) a second voltage layer for providing a second reference voltage signal to the integrated circuit chip, the first and second voltage layers being closely coupled to maximize decoupling capacitance therebetween;

at least first and second dielectric layers for separating the at least three conductive layers from each other; and a plurality of bond wires for electrically connecting the integrated circuit chip bonding pads with the signal bonding pads, the bond wire inductance being in a range from about less than 1 nH to about greater than 0.25 nH.

* * * * *